(12) United States Patent
Murphy et al.

(10) Patent No.: US 6,399,513 B1
(45) Date of Patent: Jun. 4, 2002

(54) OZONATED DI WATER PROCESS FOR ORGANIC RESIDUE AND METAL REMOVAL PROCESSES

(75) Inventors: Neal T. Murphy, Richardson; Claire Ching-Shan Jung; Danny F. Mathews, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/666,988

(22) Filed: Sep. 21, 2000

Related U.S. Application Data

(60) Provisional application No. 60/165,149, filed on Nov. 12, 1999.

(51) Int. Cl.$^7$ .............................................. H01L 21/302

(52) U.S. Cl. ...................... 438/725; 430/330; 430/331; 430/319; 430/258

(58) Field of Search .......................... 438/725; 430/330, 430/331, 319, 258

(56) References Cited

U.S. PATENT DOCUMENTS

| | | | | |
|---|---|---|---|---|
| 5,776,296 A | * | 7/1998 | Matthews | 156/345 |
| 5,882,489 A | * | 3/1999 | Bersin et al. | 204/192.35 |
| 6,009,888 A | * | 1/2000 | Ye et al. | 134/1.3 |
| 6,130,169 A | * | 10/2000 | Shields et al. | 438/725 |
| 6,143,637 A | * | 11/2000 | Yagi | 438/597 |
| 6,158,445 A | * | 12/2000 | Olesen et al. | 134/1.3 |
| 6,183,942 B1 | * | 2/2001 | Kim et al. | 430/331 |
| 6,191,086 B1 | * | 2/2001 | Leon et al. | 510/175 |
| 6,200,736 B1 | * | 3/2001 | Tan | 430/319 |

* cited by examiner

*Primary Examiner*—John F. Niebling
*Assistant Examiner*—Olivia T Luk
(74) *Attorney, Agent, or Firm*—Jacqueline J. Garner; W. James Brady, III; Frederick J. Telecky, Jr.

(57) ABSTRACT

A method for resist strip and metal contamination removal. Wafers (108) with a patterned resist formed thereon are subjected to an ozonated deionized water solution, such as mist (120). The ozonated deionized water solution (120) strips the resist and removes the resist residue. At the end of the process, HCl (152) is added to the deionized water (116) prior to forming the ozonated deionized water solution (120) to remove metal contaminants.

9 Claims, 4 Drawing Sheets

OZONATED DI WATER PROCESS FOR ORGANIC RESIDUE AND METAL REMOVAL PROCESSES

This application claims priority under 35 USC §119(e)(1) of provisional application No. 60/165,149 filed Nov. 12, 1999.

CROSS-REFERENCE TO RELATED APPLICATIONS

The following co-pending applications are related and are hereby incorporated by reference:

| Serial No. | Filing Date | Inventors |
| --- | --- | --- |
| 09/667,154 | 09/21/2000 | Jung et al. |
| 09/666,974 | 09/21/2000 | Jung et al. |
| 09/666,576 | 09/21/2000 | Murphy et al. |

FIELD OF THE INVENTION

The invention is generally related to the field of resist patterning of semiconductor devices and more specifically to resist strip and metal removal processes.

BACKGROUND OF THE INVENTION

In the fabrication of semiconductor devices, photoresist patterns are routinely used for delineating certain areas of the semiconductor device, for example, for patterned etching and ion implantation. After the etch or implantation sequence, the resist pattern must be removed. This is referred to as a resist strip. Additionally, any resist residue must also be removed. Currently, an ozonated $H_2SO_4$ operated at 130° C. or a combined solution of $H_2SO_4$ and $H_2O_2$ are widely used for resist strip. To reduce particles, the above resist strip process is followed by a SC1 ($H_2O:NH_4OH:H_2O_2$) megasonic cleanup. Alternatively, a deionized water (DIW) scrub may be used for particle removal.

Unfortunately, the chemicals described above for resist strip are not environmentally safe and require special precautions for handling and disposal. Furthermore, sulfur compounds have been found to be left on wafer surfaces after the $H_2SO_4$ cleanups, which may cause corrosions or work function shifts on devices. The SC1 clean-up may result in $NH_3$ abatement. If the alternative DIW scrub is used, two process tools are required. Accordingly, a resist strip and particle removal process is desired that is environmentally safe and overcomes the above mentioned particle removal problems.

U.S. Pat. No. 5,464,480 describes a process for removing organic materials such as photoresist without the use of $H_2SO_4$ and $H_2O_2$. Wafers are placed in a tank containing chilled deionized water. Ozone is diffused into the chilled deionized water to oxidize the organic material from the wafer surface. This process requires the addition of a chiller to current process equipment.

SUMMARY OF THE INVENTION

The invention is a method and apparatus for resist pattern strip and metal removal that uses an ozonated deionized water with HCl spiking at the end of the process for metal contamination removal. An advantage of the invention is providing a ozonated deionized water resist strip that results in reduce metal contamination and that is environmentally safe.

This and other advantages will be apparent to those of ordinary skill in the art having reference to the specification in conjunction with the drawings.

DETAILED DESCRIPTION OF THE EMBODIMENTS

The process of the present invention uses ozonated deionized water (DIW) for resist strip and HCl spiking at the end of the process for metal contamination removal. Elevated temperatures were found to result in an enhanced resist strip rate. Optimum temperatures were found to be in the range of 55–65° C. Residual analysis has showed that ozonated DI water has better removal efficiency on organic compounds. However, an increase in metal contamination was found without the use of HCl spiking at the end of the process. The process of the present invention eliminates the use of hazardous chemicals in positive resist strip and resist residue removal processes.

Because the use of a fine mist spray versus an immersion process was found to increase the resist strip rate approximately 10×, the process of the invention will be described in conjunction with a fine mist spray of ozonated DIW. However, it will be apparent to those of ordinary skill in the art that the benefits of HCl spiking according to the invention may be applied to other methods of applying ozonated DIW such as those described in co-pending U.S. patent applications Ser. Nos. 09/667,154 filed Sep. 21, 2000 and 09/666,974, filed Sep. 21, 2000.

Figure 1:
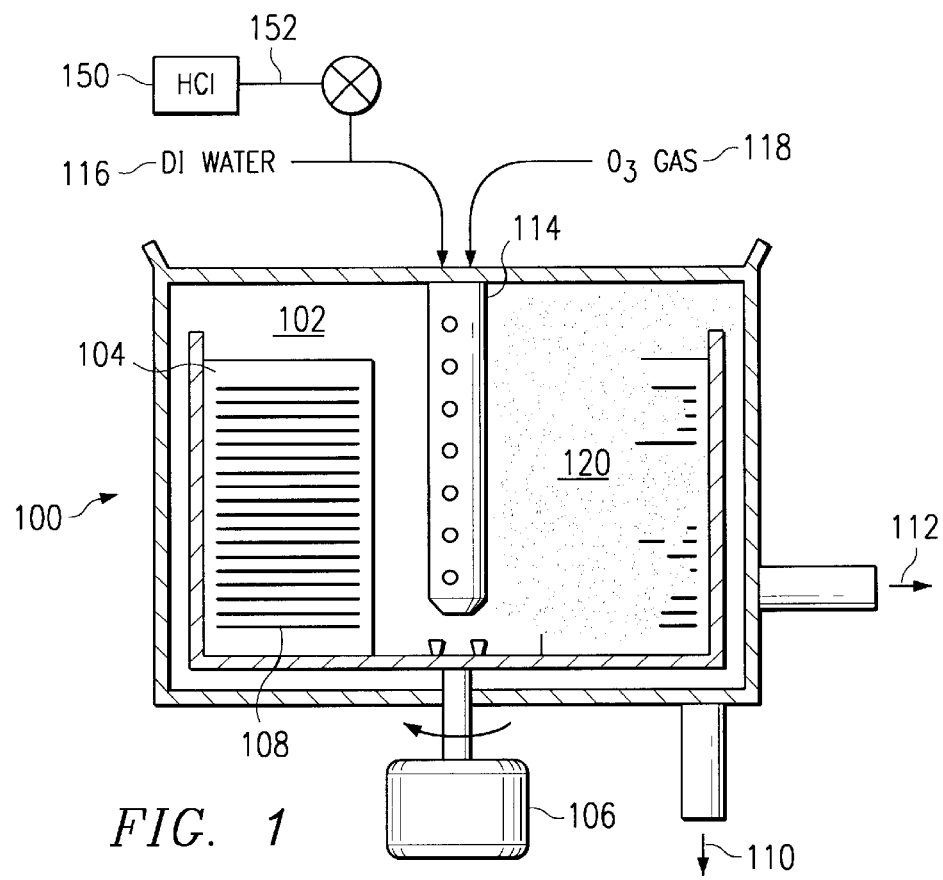
FIG. 1 is a diagram of an apparatus for removing a resist pattern and resist residue according to the invention.
Figure 2:
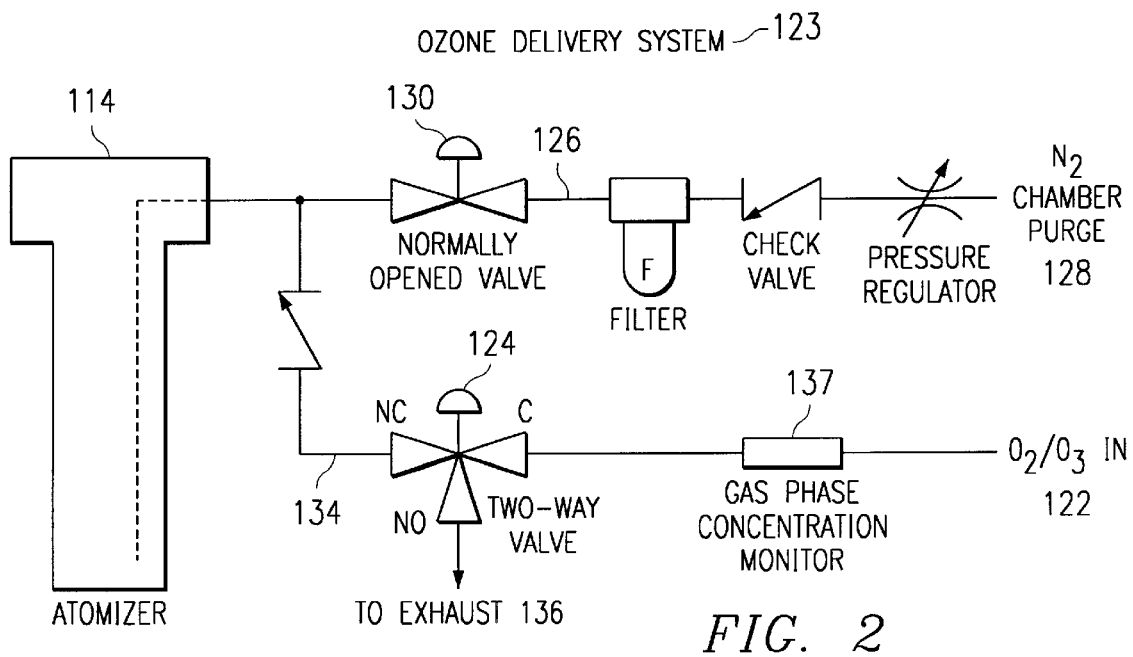
FIG. 2 is a diagram of an ozone delivery system for use with the apparatus of FIG. 1.

An apparatus 100 according to an embodiment of the invention for resist strip is shown in FIG. 1. Apparatus 100 comprises a process chamber 102. Process chamber 102 may be similar to those currently used in spray tools such as the FSI Saturn® by FSI International. Process chamber 102 includes a carrier 104 for holding wafers 108 to be processed. Carrier 104 may be rotated either clockwise or counterclockwise by motor 106. Drain 110 is located at the bottom of process chamber 102 for draining spent process liquid (e.g., deionized water). An exhaust 112 is also included to allow gases, such as ozone, to exit the process chamber 102.

Process chamber 102 also includes an atomizer 114. Deionized water (DIW) 116 and ozone gas 118 are separately added to atomizer 114. As streams of DIW 116 exit atomizer 114, jets of ozone gas 118 hit the DIW 116 and atomizes the DIW into a fine mist 120 of ozonated DIW. DIW 116 flow may be controlled using a needle valve. Fine mist 120 is sprayed onto the wafers 108 while the wafers 108 are being rotated. A spray mist of ozonated DIW 120 was found to increase the resist strip rate by approximately 10 times the resist strip rate of an immersion method. In addition, less ozone is needed because saturation of ozone concentration can be achieved more easily using atomizer 114 to pressurize DIW 116 and ensure fine mixing of DIW 116 and ozone 118 in a closed system.

Improved removal rates have been found using elevated temperatures. Therefore, DIW 116 may optionally be heated prior to mixing the DIW 116 with ozone 118. For example, DIW 116 may be heated to a temperature in the range of 55–65° C. Methods for heating a liquid such as DIW 116 are known in the art. In addition, the chamber lid 150 may be heated. Heating the ozone gas 118 has not been found to be effective in improving the removal rates. In one embodiment of the invention, the DIW 116 is heated for resist stripping, but room temperature DIW 116 is used for residue removal.

Figure 3:
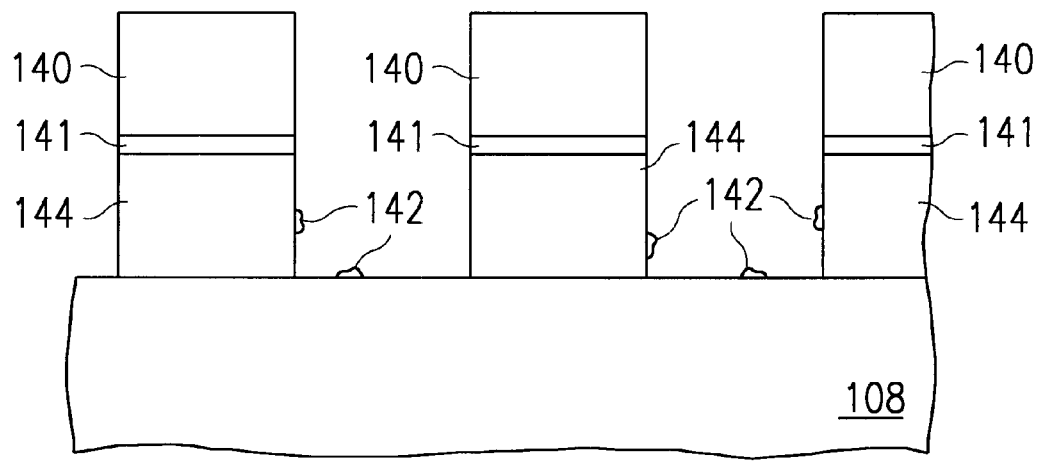
FIG. 3 is a cross-sectional diagram of a semiconductor wafer having a resist pattern formed thereon.

A suitable ozone delivery system 123 is shown in FIG. 3. $O_2/O_3$ gas 122 is supplied to two-way valve 124. Valve 124 is normally open to exhaust. Two-way valve 124 may be actuated to supply ozone gas to atomizer 114. The ozone gas may be vented to exhaust and then switched to atomizer 114 when the ozone concentration has reached a predetermined concentration. The concentration can be monitored using a gas phase ozone concentration monitor 137. When ozone gas 122 is supplied to atomizer 114, valve 130 is closed. A separate chamber purge line 126 is used to supply a purge gas 128 such as $N_2$ to the atomizer 114. The purge gas 128 is connected to a $N_2$ filter and normally opened valve 130. When it is desirable to purge the system, two-way valve 124 is de-actuated to allow gas (e.g. 122) to be exhausted. Valve 130 is, in turn, opened, to allow purge gas 128 to be supplied to atomizer 114. $O_2$ (and possibly $N_2$ or other inert gases) is used to purge line 122 and through two-way valve 124 to exhaust 136 when desired.

After being applied to wafer 108, the ozonated DIW spray 120 is preferably not recirculated. Thus, no filter is needed in a recirculation loop. The single pass of chemicals on the wafer 108 results in lower incidence of wafer-to-wafer or lot-to-lot cross-contamination.

In operation, a number of wafers 108 are loaded into carrier 104 and placed in process chamber 102. HCl 152 is stored in a pressurized canister 150 and added to the DIW 116 flow prior to entry of the DIW 116 to atomizer 114 during at least a portion of the process. HCl 152 may be added to room temperature or warm DIW 116. DIW 116 (with or without HCl spiking) and ozone gas 118 are separately added to atomizer 114. Ozone gas 118 may be supplied at a rate on the order of 50 g/m³. Atomizer 114 causes jets of ozone gas 118 to hit (and atomize) streams of DIW 116 to form a fine mist spray 120 of ozonated DIW. Ozonated DIW mist 120 is applied to wafers 108 while the wafers 108 are rotated within process chamber 102. Rotating the wafers 108 results in a uniform application of ozonated DIW mist 120. Use of both clockwise and counterclockwise rotation of wafers 108 can further improve the uniformity.

Figure 4:
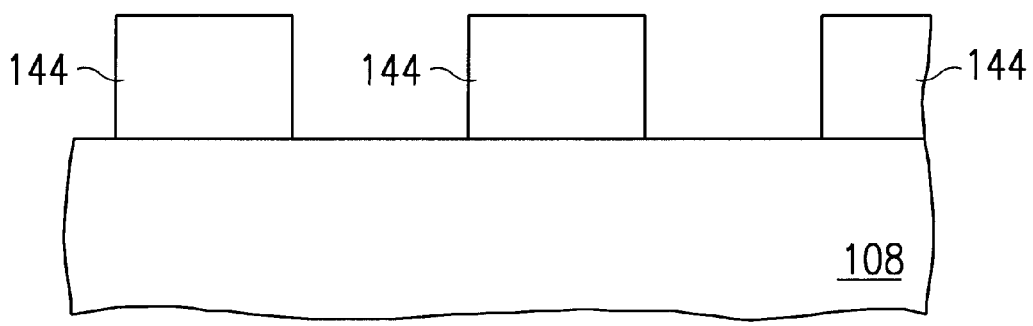
FIG. 4 is a cross-section diagram of the semiconductor wafer of FIG. 4 after resist strip and particle removal according to the invention.

Applying an ozonated DIW mist 120 strips a resist pattern and any resist residue from the surface of wafers 108. A fine mist spray 120 of ozonated DIW was found to have a 10× improvement in the resist strip rate versus an immersion process. FIG. 3 shows wafer 108 prior to application of a warm ozonated DIW mist spray 120. FIG. 3 is a cross-sectional diagram of wafer 108 with resist pattern 140 and resist residue 142 formed thereon. Resist pattern 140 may included an optional adhesion promoter 141 such as HMDS (hexamethyldisilazane). As shown in FIG. 3, resist pattern 140 may be used as a pattern for etching layer 144. Alternatively, resist pattern 140 may have been used for other purposes, such as ion implanting. Resist patterns, such as pattern 140 are used throughout the semiconductor fabrication process for forming patterned structures, masking implants, etc. During an etch process, for example, resist residue 142 may form on the exposed surface of the etched layer or layers 144. FIG. 4 shows wafer 108 after resist strip and resist residue removal according to the invention. The resist strip and residue removal process of the invention is also effective in removing adhesion promoters, such as HMDS.

Figure 5:
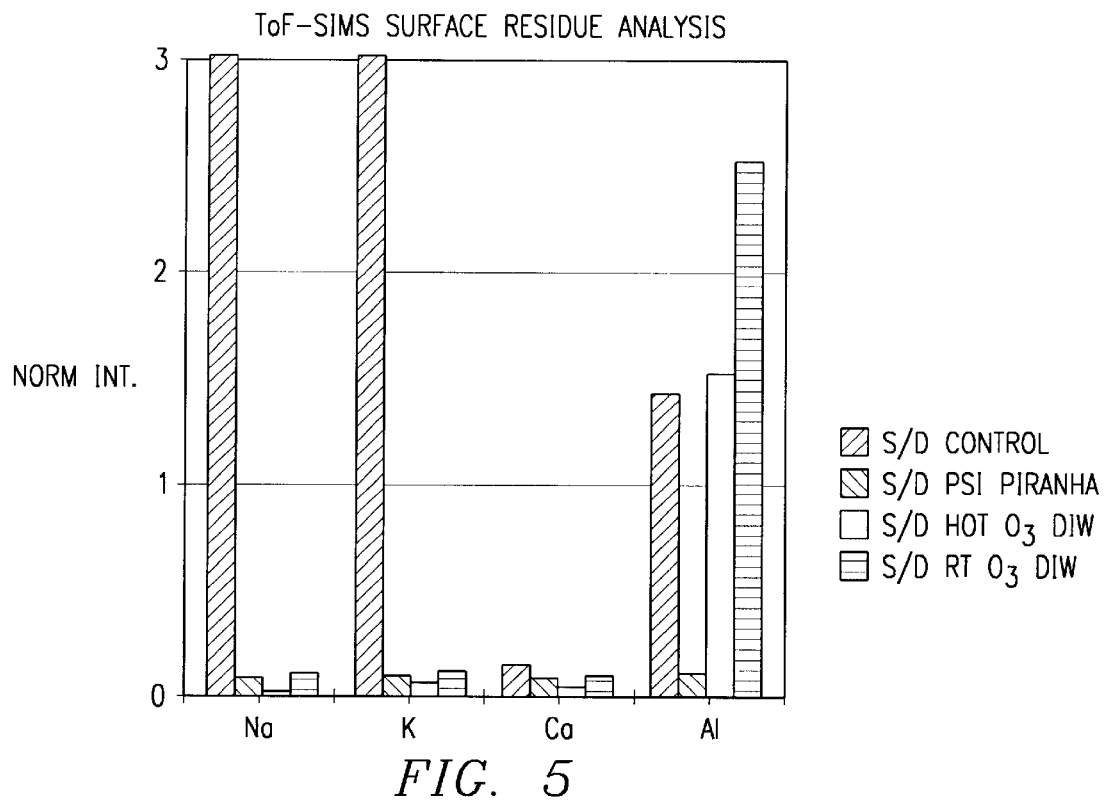
FIG. 5 is a graph of a ToF-SIMS surface residue analysis after a source/drain patterning step without the HCl spiking of the invention.
Figure 6:
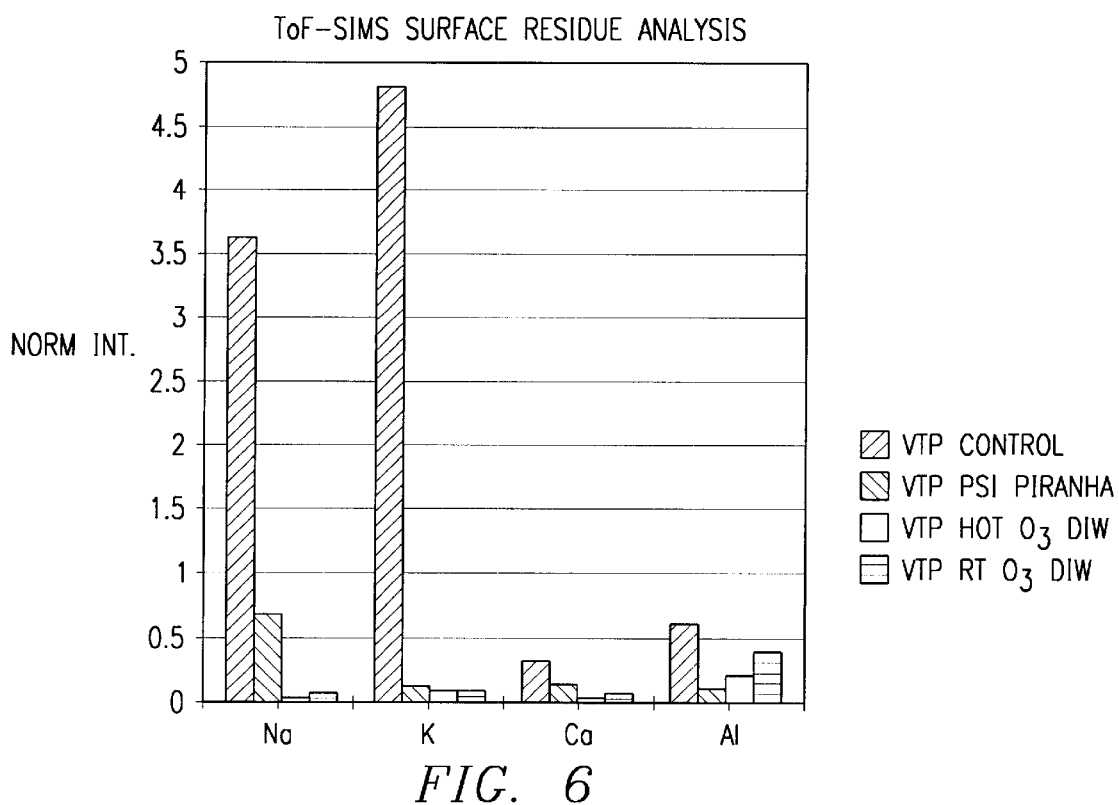
FIG. 6. is a graph of a ToF-SIMS surface residue analysis after a threshold voltage implant patterning step without the HCl spiking of the invention.

Without the addition of HCl, higher levels of metal contamination can occur versus a prior art $H_2SO_4$ and $H_2O_2$ clean. FIG. 5 is a graph of a ToF-SIMS surface residue analysis for various contaminants after a source/drain patterning and ash step. Metal (Al) contamination was much higher for ozonated DIW both at room temperature and at elevated temperatures than for a $H_2SO_4$ and $H_2O_2$ clean. FIG. 6 is a similar graph for contaminants after a patterned p-type threshold adjust implant and ash.

Figure 7:
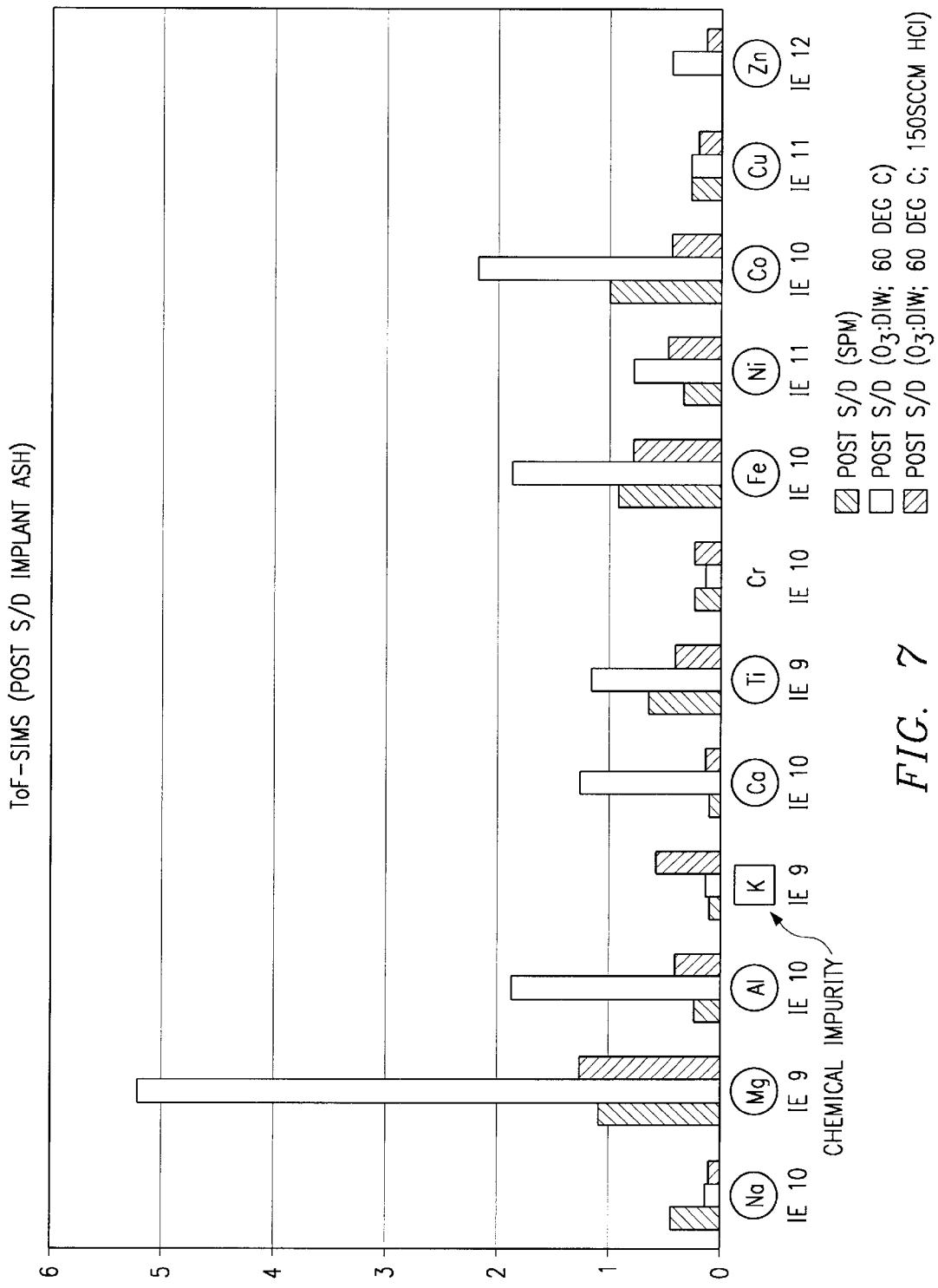
FIG. 7 is a graph of a ToF-SIMS surface residue analysis after a source/drain pattern ash step comparing the HCl spiking of the invention to an ozonated DIW resist strip process without HCl spiking.

Accordingly, HCl spiking to the ozonated DIW mist 120 may be added at the end of the process to reduce metal contamination. For example, HCl may be added to the DIW 116 flow during the entire contamination removal portion of the process (but not during the earlier resist strip portion). FIG. 7 is a graph of a ToF-SIMS analysis for various contaminants after a patterned source/drain implant ash step. Adding 150 sccm of HCl significantly reduces metal contamination. The duration of HCl spiking can be tailored depending on the amount of metal contamination expected. A typical duration is on the order of 3 minutes. In the preferred embodiment, HCl is added to the DIW 116 flow at a ratio of 5:1 (DIW:HCl).

For further metal contamination removal, the above process may be followed by a SC2 ($H_2O:HCl:H_2O_2$) rinse.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, other methods for forming and applying spray mist 120, such as in a single wafer environment, may be used. It is therefore intended that the appended claims encompass any such modifications or embodiments.

What is claimed is:

1. A method for fabricating an integrated circuit, comprising the steps of:

providing a semiconductor wafer with a resist pattern formed thereon;

spraying an ozonated deionized water solution to a surface of said semiconductor wafer to remove said resist pattern; and continuing said step of spraying the ozonated deionized water solution while adding HCl to said ozonated deionized water solution to remove metal contaminants from said surface, wherein said HCl is added to the ozonated deionized water solution only after removing said resist pattern and not during removal of said resist pattern.

2. The method of claim 1, wherein said ozonated deionized water solution has an elevated temperature in the range of 55 to 65° C.

3. The method of claim 1, wherein said ozonated deionized water solution is a spray mist is formed by combining deionized water with ozone in an atomizer.

4. A method for fabricating an integrated circuit, comprising the steps of:

provilding a semiconductor wafer with a resist pattern formed thereon;

spraying an ozonated deionized water solution to a surface of said semiconductor wafer to remove said resist pattern, wherein said ozonated deionized water solution is a spray mist is formed by combining deionized water with ozone in an atomizer; and after removing said resist pattern, continuing said step of spraying the ozonated deionized water solution while adding HCl to said ozonated deionized water solution to remove metal contaminants from said surface, wherein said step of adding HCl adds HCl to said deionized water prior to supplying said deionized water to said atomizer.

5. The method of claim 4, wherein a ratio of deionized water to HCl is on the order of 5:1.

6. The method of claim 1, further comprising the step of rotating said semiconductor wafer during said spraying step.

7. The method of claim 6, wherein said step of rotating said semiconductor wafer comprises alternately rotating said semiconductor wafer in a clockwise direction and a counterclockwise direction.

8. The method of claim 1, wherein said step of adding HCl has a duration on the order of 3 minutes.

9. The method of claim 1, wherein said step of adding HCl adds approximately 150 sccm of HCl.

* * * * *